United States Patent
Patel et al.

[19]

[11] Patent Number: 6,003,226
[45] Date of Patent: Dec. 21, 1999

[54] METHOD FOR MANUFACTURING ELECTRICAL CONNECTORS

[75] Inventors: Arvind Patel, Naperville; Nels Pearson, Deerfield; Jack J. Schafer, LaGrange, all of Ill.

[73] Assignee: Molex Incorporated, Lisle, Ill.

[21] Appl. No.: 08/856,033

[22] Filed: May 14, 1997

[51] Int. Cl.$^6$ .................................................. H01R 43/04
[52] U.S. Cl. ............................... 29/881; 29/749; 29/842; 29/844; 29/845
[58] Field of Search ............................. 29/747, 748, 749, 29/842, 844, 845, 23 M

[56] References Cited

U.S. PATENT DOCUMENTS

| | | | |
|---|---|---|---|
| 4,088,384 | 5/1978 | Gumb | 339/156 R |
| 4,109,991 | 8/1978 | Evans | 339/99 R |
| 4,193,654 | 3/1980 | Hughes et al. | 339/17 LC |
| 4,202,593 | 5/1980 | Abernethy et al. | 339/125 R |
| 4,210,376 | 7/1980 | Hughes et al. | 339/17 LC |
| 4,292,736 | 10/1981 | Hughes et al. | 29/884 |
| 4,296,550 | 10/1981 | Kobler | 29/884 |
| 4,327,958 | 5/1982 | Hughes et al. | 339/276 SF |
| 4,605,276 | 8/1986 | Hasircoglu | 339/176 MF |
| 4,618,207 | 10/1986 | Silbernagel | 339/176 M |
| 4,647,136 | 3/1987 | Kinoshita et al. | 339/125 R |
| 4,734,043 | 3/1988 | Emert et al. | 439/65 |
| 4,762,507 | 8/1988 | Rudy, Jr. et al. | 439/595 |
| 4,767,355 | 8/1988 | Phillipson et al. | 439/425 |
| 4,786,259 | 11/1988 | Paul | 439/344 |
| 4,842,528 | 6/1989 | Frantz | 439/80 |
| 4,850,902 | 7/1989 | Reed | 439/676 |
| 4,908,335 | 3/1990 | Cosmos et al. | 439/79 |
| 5,304,074 | 4/1994 | Andre et al. | 439/417 |

FOREIGN PATENT DOCUMENTS

| | | | |
|---|---|---|---|
| 2677178 | 12/1992 | France | H01R 9/09 |

*Primary Examiner*—Lee Young
*Assistant Examiner*—Kevin G Vereene
*Attorney, Agent, or Firm*—Stephen Z. Weiss

[57] ABSTRACT

A method is provided for manufacturing an electrical connector which includes a dielectric housing having a plurality of side-by-side channels separated by partition walls at one side of the housing. A plurality of terminals are mounted on the housing, with lead portions of the terminals located in the channels. The method includes the steps of seating the lead portions of the terminals into the channels, and forming first or minor portions from the partition walls onto the lead portions to retain the lead portions in the channels. Second or major portions of the partition walls then are formed onto the first or minor portions which are in contact with the lead portions to securely lock the lead portions in the channels. The seating step and the first forming step may be carried out simultaneously.

16 Claims, 5 Drawing Sheets

METHOD FOR MANUFACTURING ELECTRICAL CONNECTORS

FIELD OF THE INVENTION

This invention generally relates to the art of electrical connectors and, particularly, to a method of manufacturing a multi-terminal connector, such as a modular telephone jack.

BACKGROUND OF THE INVENTION

A widely used type of electrical connector receptacle commonly is referred to as a "jack". Such connectors are widely used in the telephone industry and with other consumer products which require relatively small electrical connectors. Such connectors or jacks typically include a dielectric housing having a front mating end with a plug-receiving opening. A plurality of terminals are mounted in the housing and have spring contact portions extending in a cantilevered fashion into the plug-receiving opening. The terminals have lead portions, such as solder tails, which project from a terminating end of the housing remote from the mating end. Some form of means are provided to hold the lead or tail portions of the terminals in precise locating positions for insertion into holes in a printed circuit board or for surface connection to contact pads on the board.

Heretofore, the lead or tail portions of the terminals have been located and held to the connector housing by many different arrangements or methods. Such methods including melting the walls of terminal-receiving channels with a heating element or an ultrasonic horn to cause the dielectric (plastic) material of the housing alongside the channels to flow and solidify over the terminal portions. Another method involves forcing barbs projecting laterally from edges of the terminal portions into the channel walls, or to simply force enlarged edge portions of the terminals into the channels with an interference fit. Portions of the channel walls also have been formed over the terminal portions without the application of heat, e.g. "cold staking" to flow plastic material over the edges of the terminal portions.

All of the above manufacturing methods of the prior art suffer from various disadvantages or problems. For instance, while melting processes create fairly strong retention joints, these processes are relatively expensive, requiring expensive machines to melt the plastic housing either by a heating element or an ultrasonic horn. While the use of barbs or enlarged terminal edge portions forced into an interference fit within the channels is an inexpensive alternative, these methods result in considerably weaker retention joints between the terminal portions and the housing.

Cold staking of the channel walls over the edges of the terminals creates a strong joint with the terminal portions, but cold staking processes have problems in accurately locating the lead or tail portions of the terminals. In particular, typically the tail portions first are seated into their respective channels. The material of the channel walls then are forced or cold staked over the lead portions. During the cold staking process, significant forces are created in the bases of the channel walls causing some material from the base to flow between the terminal and the housing thereby causing the terminals to become slightly dislocated away from the housing from the bottom of the channels, resulting in inaccurately located lead portions which are misaligned with respect to the holes or circuit traces on the printed circuit board.

The present invention is directed to solving the various problems and overcoming the various disadvantages of the prior art enumerated above.

SUMMARY OF THE INVENTION

An object, therefore, of the invention is to provide a new and improved method of manufacturing an electrical connector, such as a modular telephone jack. Although the invention is disclosed herein in conjunction with a jack-type connector, it should be understood that the concepts of the invention, in efficiently and accurately locating terminal portions relative to a dielectric housing, are equally applicable for other types of electrical connectors.

With that understanding, the method is disclosed herein in conjunction with an electrical connector which includes a dielectric housing having a mating end with a plug-receiving opening. A terminating end is remote from the mating end, and a top of the housing extends between the ends. A plurality of terminals are mounted on the housing, with lead portions of the terminals located at the terminating end of the housing.

The method of the invention includes the steps of producing the dielectric housing with a plurality of side-by-side locating channels separated by partition walls at the terminating end of the housing. The lead portions of the terminals are seated into the channels. Minor portions are scraped from the partition walls onto the lead portions of the terminals to retain the lead portions in the channels. Major portions of the partition walls then are formed onto the minor portions which are in contact with the lead portions of the terminals to securely lock the lead portions in the channels.

As disclosed herein, the seating and scraping steps are carried out simultaneously, preferably by a single seating/scraping tool blade. The forming step is carried out by a cold staking operation.

With the method of the invention being disclosed in conjunction with a modular telephone jack, intermediate portions of the terminals are secured to the top of the dielectric housing prior to the aforesaid seating step. The lead portions of the terminals are bent into juxtaposition with the channels at the terminating end of the housing after the intermediate portions are secured to the top of the housing and prior to the seating step. Contact portions of the terminals are bent into the plug-receiving opening at the mating end of the housing.

Other objects, features and advantages of the invention will be apparent from the following detailed description taken in connection with the accompanying drawings.

BRIEF DESCRIPTION OF THE DRAWINGS

The features of this invention which are believed to be novel are set forth with particularity in the appended claims. The invention, together with its objects and the advantages thereof, may be best understood by reference to the following description taken in conjunction with the accompanying drawings, in which like reference numerals identify like elements in the figures and in which:

DETAILED DESCRIPTION OF THE PREFERRED EMBODIMENT

Figure 1:
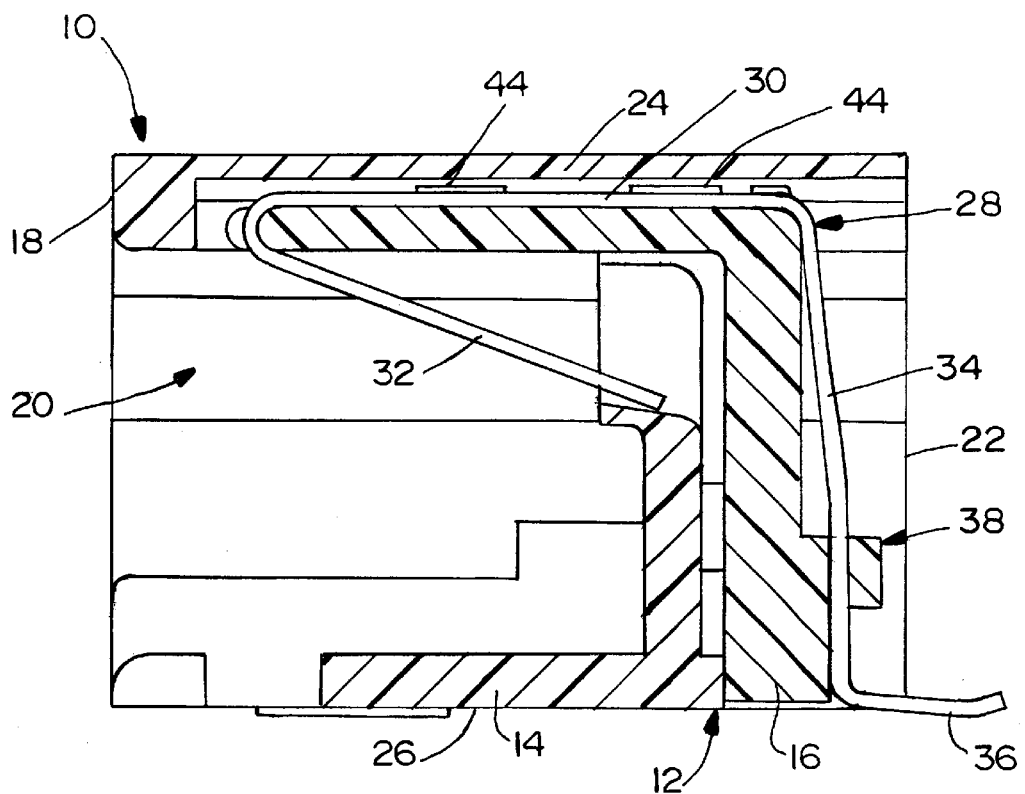
FIG. 1 is a front-to-rear section through a jack-type electrical connector, with the terminals having been mounted and secured according to the invention.

Referring to the drawings in greater detail, and first to FIG. 1, the method of the invention is illustrated herein in conjunction with a modular telephone jack, generally designated 10, which includes a two-piece housing, generally designated 12. Although modular jacks have been fabricated with a one-piece housing, some jacks have two-piece housings to facilitate assembly. In particular, housing 12 includes an outer housing shell 14 and an inner insert 16. Whether the housing consists of one or more pieces, the housing has a mating end 18 with a plug-receiving opening, generally designated 20, a terminating end 22 remote from the mating end and a top 24 extending between the ends. The housing has a bottom face 26 adapted for surface mounting on the top surface of a printed circuit board. Each housing shell 14 and insert 16 is unitarily molded of dielectric material such as plastic.

A plurality of terminals, generally designated 28, are mounted on housing 12, particularly on insert 16. Each contact 28 includes a top intermediate portion 30, a front contact end or portion 32 and a rear lead portion 34. The lead portion may comprise a solder tail for insertion into an appropriate hole in the printed circuit board for solder connection to circuit traces on the board and/or in the hole. On the other hand, lead portion 34 may terminate in a foot portion 36 for surface connection, as by soldering, to a solder pad on the printed circuit board. Regardless of whether the lead portion is a solder tail for insertion into a hole in the circuit board, or the lead portion has a foot 36 for solder connection to a pad on the board, it is critical that the lead portions 34 of terminals 28 be precisely located on jack 10 for precise positioning and spacing relative to the circuit traces on the board. The alignment and retention of lead portions 34 is provided at a terminal retention area, generally designated 38, at the rear terminating end 22 of jack 10.

FIGS. 2A–2G show the steps in assembling modular jack 10. Before proceeding with the details of this manufacturing process, a brief reference is made to FIG. 3A wherein termination area 38 (FIG. 1) starts out as a comb-like structure defined by a plurality of partition walls 40 spaced horizontally along the back side of housing insert 16, to form channels 42 between adjacent partition walls. Lead portions 34 of terminals 28 are inserted into these channels during the process described below in relation to FIGS. 2A–2G.

Figure 2A:
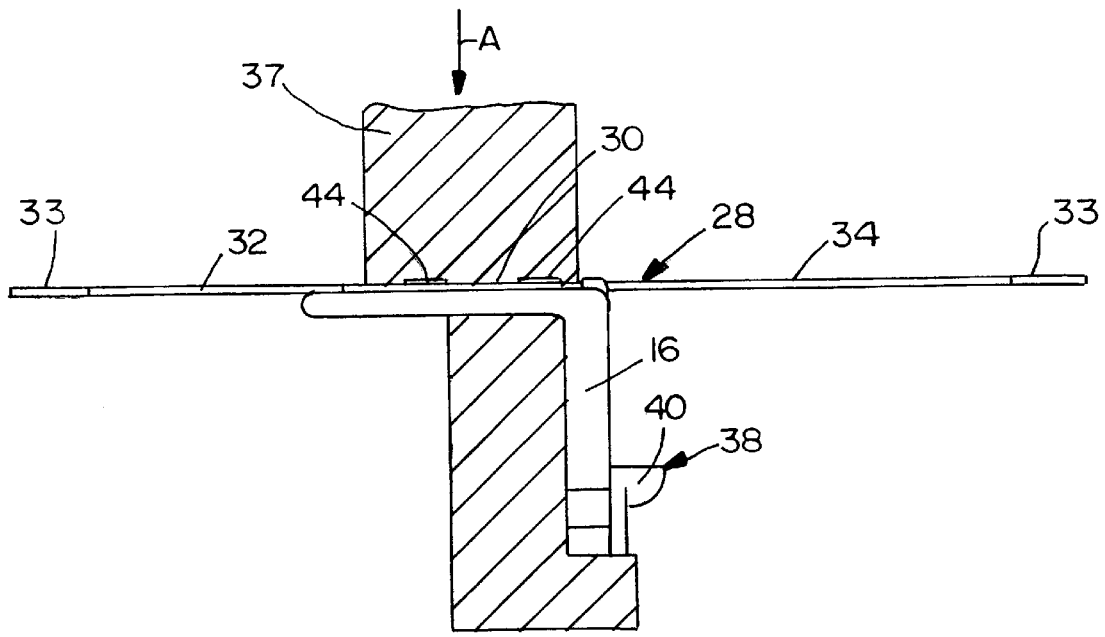
FIGS. 2A–2G are sequential views representing steps in manufacturing the connector according to the method of the invention.
Figure 3A:
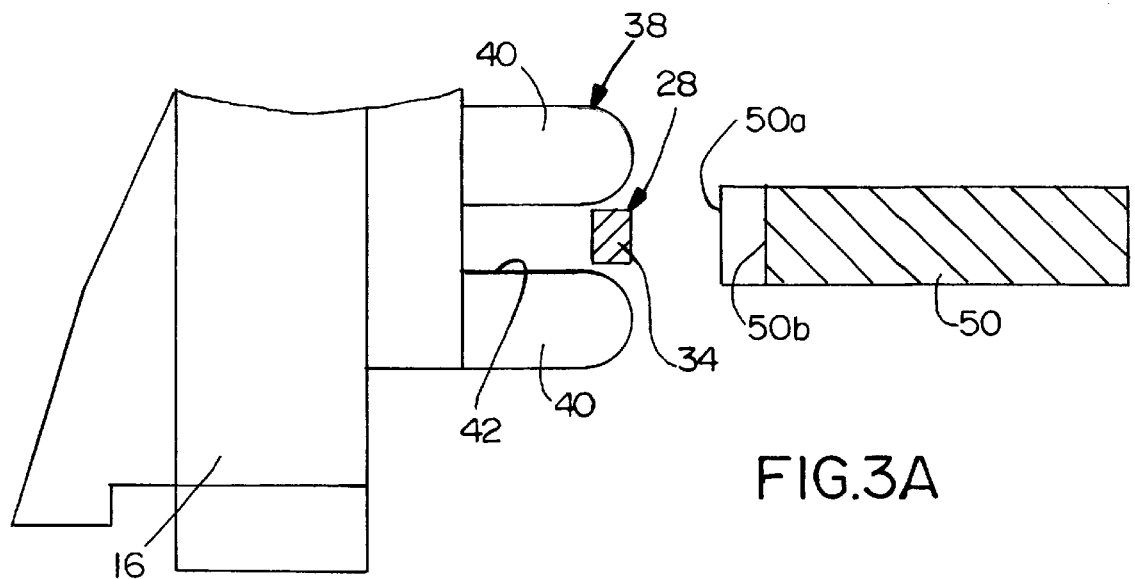
FIGS. 3A–3D show sequential steps in inserting the lead or tail portion of one of the terminals into its respective channel.

More particularly, each terminal 28 is stamped and formed of conductive sheet metal material in a straight configuration as shown in FIG. 2A, whereby intermediate portion 30, contact portion 32 and lead portion 34 of the terminal are in a strip form. The distal ends of contact portion 32 and lead portion 34 are shown still connected to carrier strips 33 from the stamping operation. Intermediate portion 30 is provided with a pair of apertures 35 which embrace a pair of integral bosses 44 projecting upwardly from the top of insert 16. After the insert is mounted on anvil 46, as shown in FIG. 2A, the carrier strips 33 are removed. Bosses 44 then are cold staked over intermediate portion 30 to rigidly secure the stamped terminal to insert 16 as shown in FIG. 2A. All of terminals 28 of jack 10 typically are secured simultaneously to insert 16 in this manner with the movements of punch 37 in the direction of arrow "A".

Figure 2B:
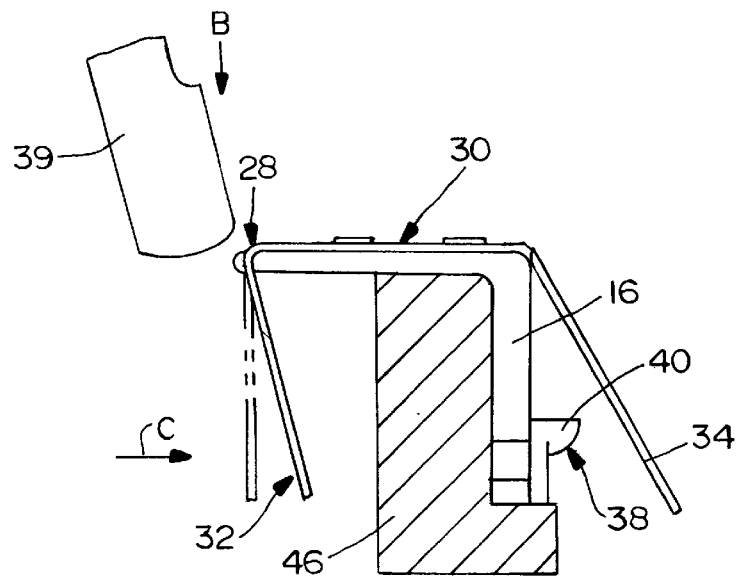

As seen in FIG. 2B the contact portions 32 of the terminals then are bent downwardly about the front edge of the insert in a two movement operation. Punch 39 first moves in the direction of arrow "B" bending contact portion 32 generally 90 degrees from the intermediate portion 30 to the position shown in phantom in FIG. 2B. Thereafter punch 39 moves in the direction of arrow "C" bending contact portion 32 into its final position as shown.

Figures 2C, 2D:
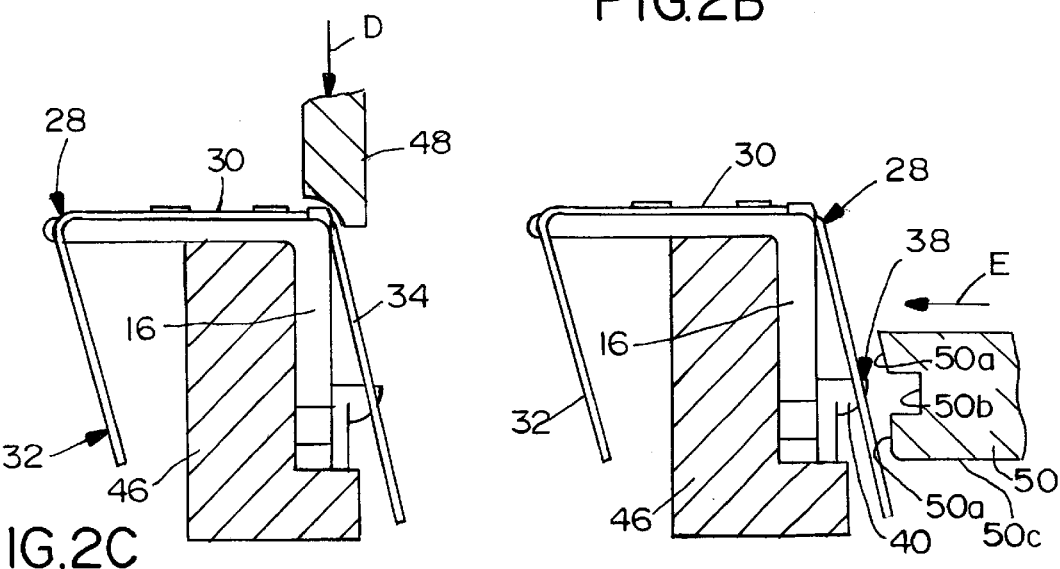

In FIG. 2C a forming punch 48 is moved downwardly in the direction of arrow "D" to bend lead or tail portions 34 of the terminals into juxtaposition near retention area 38 of the insert.

Figures 2E, 2F:
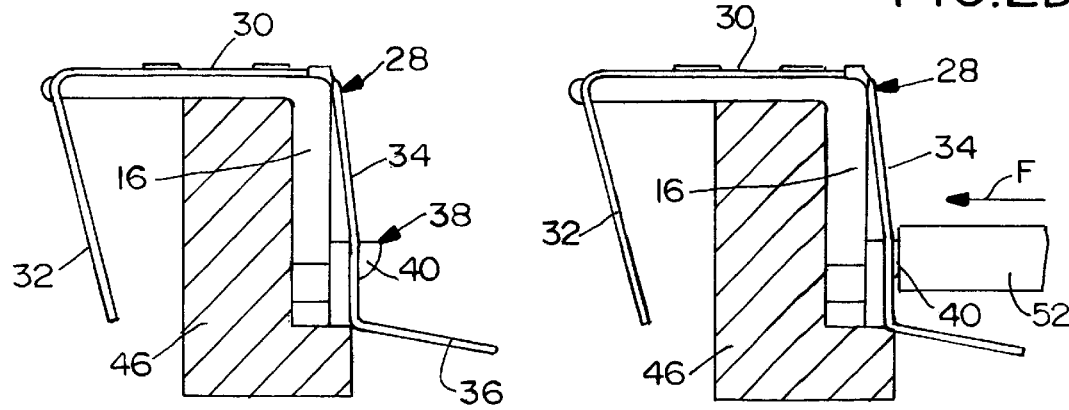

A seating/scraping tool blade 50 then is moved in the direction of arrow "E" as seen in FIG. 2D to engage and drive lead portions 34 of the terminals into channels 42 (FIG. 3A) between partition walls 40 until lead portions 34 are seated in retention area 38 as shown in FIG. 2E. As will be understood in greater detail hereinafter when describing FIGS. 3A–3D, tool blade 50 performs three functions, namely: (1) seating lead portions 34 of the terminals against the bottoms or bases of channels 42, (2) scraping minor portions of partition walls 40 onto the lead portions to retain the lead portions in the channels, and (3) bending the lower portion of the tail portion 34 forming foot 36. To this end, tool blade 50 (FIG. 2D) has forwardly projecting edge portions 50a which effect the seating function, a recessed edge portion 50b which effects the scraping function, and lower portion 50c which interacts with the lower shelf portion of anvil 46 effecting the foot bending function.

After lead portions 34 of terminals 28 are seated into the channels at retention area 38 as shown in FIG. 2E, a smashing punch 52 then is moved in the direction of arrow "F" as shown in FIG. 2F to engage partition walls 40 at retention area 38. The tool is effective to force or form major portions of partition walls 40 onto the minor portions of partition walls 40 which are in contact with lead portions 34 to securely lock the lead portions in channels 42. In other words, the partition walls are "cold staked" over the minor portions by punch 52.

Figure 2G:
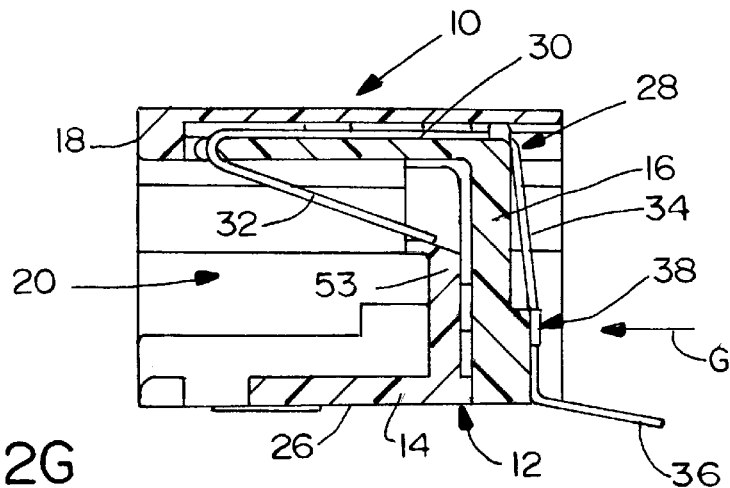

The assembly of insert 16 and secured terminals 28 then is inserted into the rear of housing shell 14 in the direction of arrow "G" as seen in FIG. 2G. During assembly, contact portions 32 of the terminals lodge in a comb structure 53 on the inside of the housing as is known in the art. The contact portions, thereby, are spring-loaded within the jack.

FIGS. 3A–3D show the sequence of inserting and securing lead portion 34 of one of the terminals 28 into its respective channel 42 between adjacent partition walls 40. In particular, FIG. 3A corresponds to the depiction of FIG. 2D wherein lead portion 34 of the terminal has been bent into juxtaposition at the rear of insert 16 near termination area 38. Seating/scraping tool blade 50 is shown in position about to insert the lead portion into its channel.

Figure 3B:
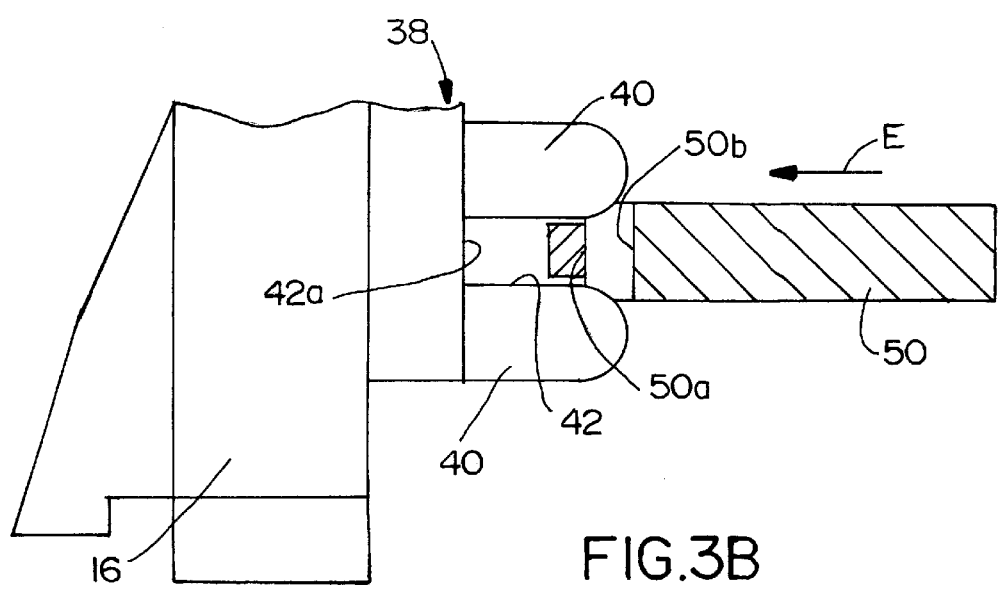

FIG. 3B shows tool blade 50 having been moved in the direction of arrow "E" to initially drive lead portion 34 into channel 42 between partition walls 40. The lead portion has yet to bottom-out at the base 42a of the channel. It can be seen that leading edges 50a of the blade have engaged lead portion 34, but recessed edge 50b of the blade has yet to engage partition walls 40. That is because the leading edges are forward of the recessed edge in the direction of arrow "E" as seen in both FIGS. 2D and 3B.

Figure 3C:
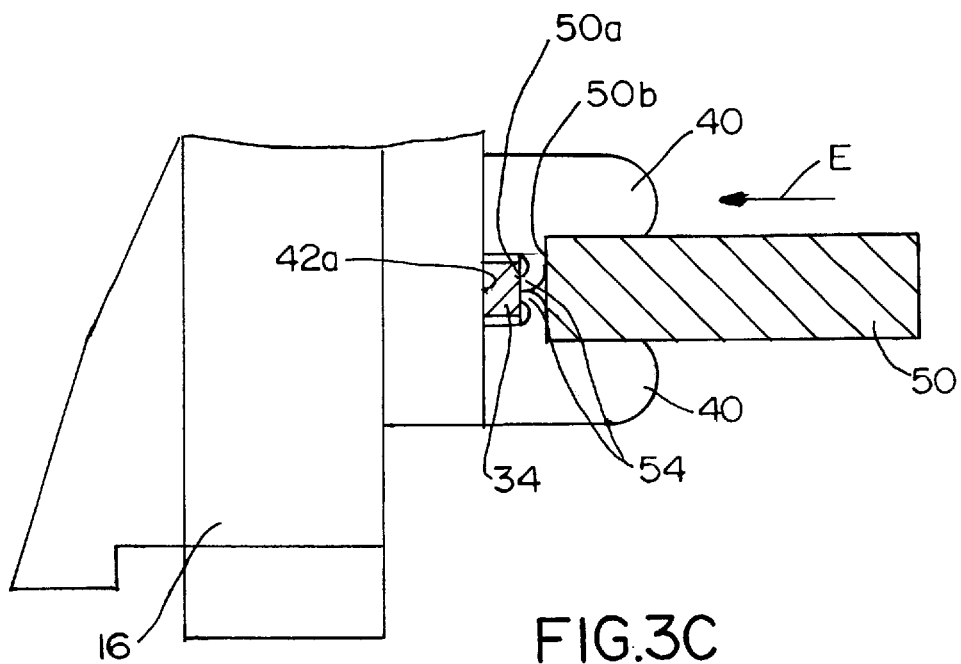

Tool 50 is moved further in the direction of arrow "E" as shown in FIG. 3C until leading edges 50a of the tool have driven lead portion 34 of the terminal against base 42a. During this action, recessed edge 50b of the tool is effective to scrape minor portions 54 of the plastic material from partition walls 40 into engagement with lead portion 34 opposite base 42a. In essence, these minor portions 54 of the plastic material of the partition walls are effective to "temporarily" retain the lead portion of the terminal at the bottom of the channel until major portions of the partition walls can be permanently cold staked against the minor portions.

Figure 3D:
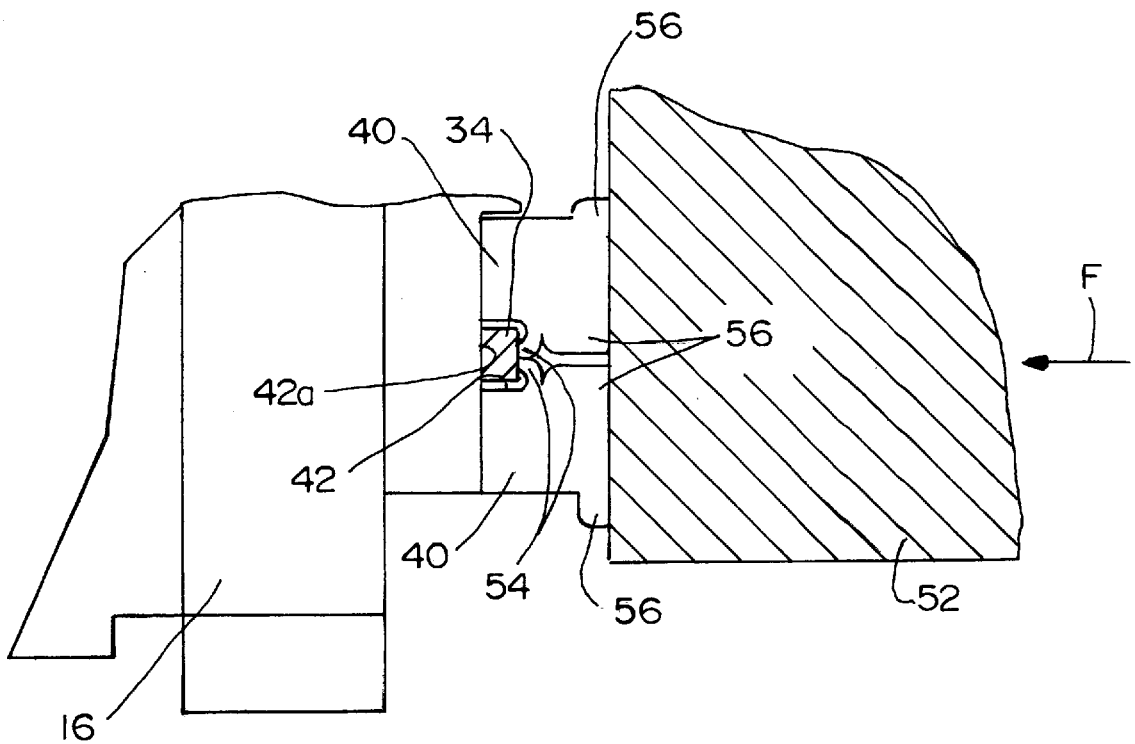

FIG. 3D shows the final step in securing lead portions 34 of the terminals in their respective channels 42 corresponding to the depiction described above in relation to FIG. 2F. Specifically, punch 52 is moved in the direction of arrow "F" to force or form major portions 56 of partition walls 40 onto the minor portions 54 in contact with the lead portion 34 to securely lock the lead portion in its respective channel 42. In other words, punch 52 cold stakes the partition walls onto the lead portions of the terminals.

As stated in the "Background", above, one of the problems with prior art cold-staking type operations is that the forces involved during the forming operation often causes the lead portions of at least some of the terminals to lift off of the bases of their respective channels. However, with the method of the invention, minor portions 54 of the plastic material which have been scraped from the sides of partition walls 40 are effective to retain the lead portions at the bottoms of the channels during the more massive cold staking operation.

Figure 4:
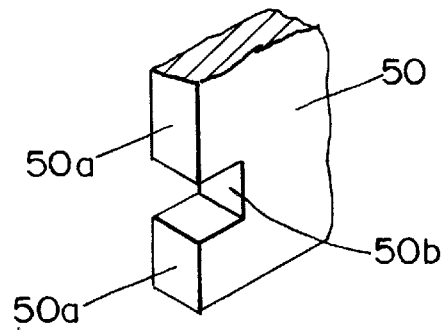
FIG. 4 is a fragmented perspective view of the leading edge of the seating/scraping tool blade used with the invention.
Figure 5:
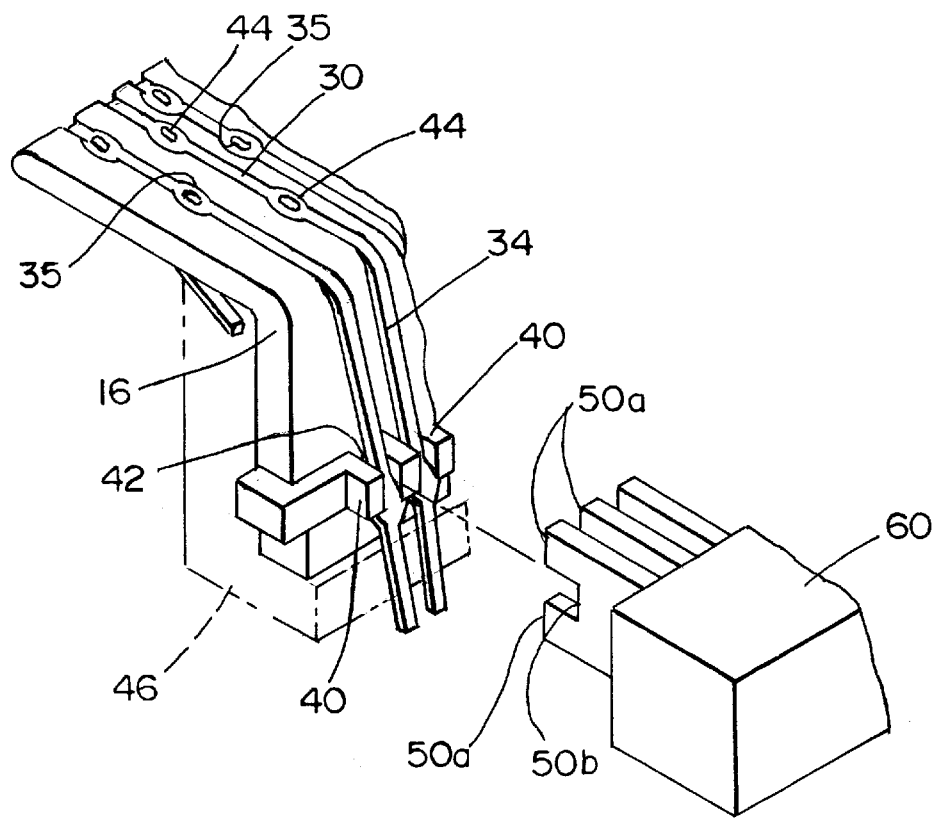
FIG. 5 is a perspective view of a composite seating/scraping tool used to gang insert the tail portions of a plurality of terminals and scrape minor portions of the partition walls.

FIGS. 4 and 5 simply show in greater detail the construction of combination seating/scraping tool blade 50 which includes its leading seating portions 50a, its recessed scraping portion 50b, and its lower portion 50c. Actually, a plurality of blades 50 are mounted to a block 60 as shown in FIG. 5, with one blade 50 being provided for each lead portion 34 and its respective channel 42. It can be seen in FIG. 5 that leading edges 50a of blades 50 move over the tops and bottoms of partition walls 40 to force the lead portions of the terminals into the bottoms of their respective channels. With edges 50b of the blades being recessed, these edges can be aligned, as shown, with partition walls 40 and thereby scrape minor plastic portions from the walls to retain the lead portions in the channels prior to the final cold staking operation.

It should be understood that portions 54 and 56 of partition walls 40 have been described herein and in the claims hereof as "minor" and "major" portions, respectively. However, it should be understood that the invention contemplates that these portions simply be "first" and "second"portions, respectively. In other words, tool 50 may be effective to scrape first portions of the partition walls onto the lead portions of the terminals sufficiently to retain the terminals in the channels, and tool 52 is effective to cold form second portions of the partition walls over the first portions. While the first portions 54 may be insufficient to securely or permanently hold the lead portions in the channels, the totality of the first portions plus the second portions 56 would be sufficient to securely hold the lead portions in the channels. This would be regardless of whether the first portions are minor portions or not, in relation to the second portions.

It will be understood that the invention may be embodied in other specific forms without departing from the spirit or central characteristics thereof. The present examples and embodiments, therefore, are to be considered in all respects as illustrative and not restrictive, and the invention is not to be limited to the details given herein.

We claim:

1. A method of manufacturing an electrical connector which includes a dielectric housing having a mating end with a plug-receiving opening, a terminating end remote from the mating end and a top extending therebetween, and a plurality of terminals mounted on the housing with lead portions located at the terminating end of the housing, said method comprising the steps of:

producing said dielectric housing with a plurality of side-by-side locating channels each channel have a bottom and separated by partition walls at said terminating end, seating the lead portions of the terminals into said channels, scraping minor portions from the partition walls into contact with a side of the lead portions of the terminals opposite a side of the lead portions in contact with the bottom of the channels to retain the lead portions at the bottom of the channels, and forming major portions of the partition walls onto the minor portions in contact with the lead portions of the terminals to securely lock the lead portions in the channels.

2. The method of claim 1 wherein said seating and scraping steps are carried out simultaneously.

3. The method of claim 2 wherein said seating and scraping steps are carried out by a single seating/scraping tool blade.

4. The method of claim 1 wherein intermediate portions of the terminals are secured to the top of the dielectric housing prior to said seating step.

5. The method of claim 4 wherein said lead portions of the terminals are bent into juxtaposition with the channels at the terminating end of the housing after the intermediate portions are secured to the top of the housing and prior to said seating step.

6. The method of claim 1 wherein contact portions of the terminals are bent into the plug-receiving opening at the mating end of the housing.

7. The method of claim 1 wherein said forming step is carried out by a cold staking operation.

8. A method of manufacturing an electrical connecter which includes a dielectric housing having a plurality of side-by-side channels each channels, having a bottom and separated by partition walls at one side thereof, and a plurality of terminals mounted on the housing with lead portions of the terminals located in said channels, said method comprising the steps of:

seating the lead portions of the terminals into said channels, forming first portions from the partition walls into contact with a side of the lead portions of the terminals opposite a side of the lead portions in contact with the bottom of the channels to retain the lead portions at the bottom of the channels, and forming second portions from the partition walls onto the first portions in contact with the lead portions of the terminals to securely lock the lead portions in the channels.

9. The method of claim 8 wherein said seating step and said first forming step are carried out simultaneously.

10. The method of claim 9 wherein said seating step and said first forming step are carried out by a single tool blade.

11. The method of claim 8 wherein said second forming step is carried out by a cold staking operation.

12. The method of claim 8 wherein said first forming step is carried out by a scraping operation.

13. The method of claim 12 wherein second forming step is carried out by a cold staking operation.

14. The method of claim 8 wherein said first forming step forms only minor portions of the partition walls onto the lead portions of the terminals.

15. The method of claim 14 wherein said second forming step forms major portions of the partition walls onto the lead portions of the terminals.

16. A method of manufacturing an electrical connector which includes a dielectric housing having a plurality of side-by-side channels, each channel having a bottom and separated by partition walls at one side thereof, and a plurality of terminals mounted on the housing with lead portions of the terminals located in said channels, said method comprising the steps of:

seating the lead portions of the terminals into said channels, forming first portions from the partition walls at a first location into contact with a side of the lead portions of the terminals opposite a side of the lead portions in contact with the bottom of the channels to retain the lead portions at the bottom of the channels, and forming second portions from the partition walls onto the lead portions at a second location adjacent said first location to securely lock the lead portions in the channels.

* * * * *